(12) United States Patent
Nikolova et al.

(10) Patent No.: US 7,887,693 B2
(45) Date of Patent: Feb. 15, 2011

(54) ACID COPPER ELECTROPLATING BATH COMPOSITION

(76) Inventors: Maria Nikolova, 48 Craftwood Rd., Apt. 5E, Waterbury, CT (US) 06704; Gary B. Larson, 33 Surrey Dr., Cheshire, CT (US) 06410

( * ) Notice: Subject to any disclaimer, the term of this patent is extended or adjusted under 35 U.S.C. 154(b) by 682 days.

(21) Appl. No.: 11/821,206

(22) Filed: Jun. 22, 2007

(65) Prior Publication Data

US 2008/0314757 A1 Dec. 25, 2008

(51) Int. Cl.
C25D 3/38 (2006.01)
H05K 3/00 (2006.01)
C23C 18/40 (2006.01)

(52) U.S. Cl. .................. 205/298; 205/125; 106/1.26

(58) Field of Classification Search ........... 205/125, 205/298; 106/1.26
See application file for complete search history.

(56) References Cited

U.S. PATENT DOCUMENTS

| | | | | |
|---|---|---|---|---|
| 3,725,220 A * | 4/1973 | Kessler et al. | ............ | 205/296 |
| 4,336,114 A * | 6/1982 | Mayer et al. | ............ | 205/298 |
| 4,394,130 A * | 7/1983 | Moser | ............ | 8/661 |
| 4,469,564 A * | 9/1984 | Okinaka et al. | ............ | 205/125 |
| 4,515,829 A * | 5/1985 | Deckert et al. | ............ | 427/97 |
| 4,810,333 A * | 3/1989 | Gulla et al. | ............ | 204/15 |
| 4,895,739 A * | 1/1990 | Bladon | ............ | 427/304 |
| 4,952,286 A * | 8/1990 | Bladon et al. | ............ | 204/15 |
| 5,007,990 A * | 4/1991 | Bladon | ............ | 204/15 |
| 5,252,196 A * | 10/1993 | Sonnenberg et al. | ............ | 205/296 |
| 6,444,110 B2 * | 9/2002 | Barstad et al. | ............ | 205/123 |
| 6,652,731 B2 * | 11/2003 | Cobley et al. | ............ | 205/296 |
| 7,018,456 B2 * | 3/2006 | Katoh et al. | ............ | 106/31.49 |
| 7,186,326 B2 * | 3/2007 | Shalyt et al. | ............ | 205/81 |
| 2002/0175080 A1 | 11/2002 | Teerlinck et al. | ............ | 205/291 |
| 2003/0070934 A1 | 4/2003 | Cobley et al. | ............ | 205/263 |
| 2003/0106802 A1 * | 6/2003 | Hagiwara et al. | ............ | 205/297 |
| 2004/0231995 A1 * | 11/2004 | Murao | ............ | 205/125 |
| 2006/0226021 A1 * | 10/2006 | Brunner et al. | ............ | 205/298 |
| 2007/0108062 A1 * | 5/2007 | Brunner et al. | ............ | 205/291 |

FOREIGN PATENT DOCUMENTS

JP 07157890 A * 6/1995
SU 358421 A * 11/1972

OTHER PUBLICATIONS

A4045 Alcian Blue-tetrakis(methylpyridinium) chloride. Datasheet [online] Sigma-Alrich [retrieved on Aug. 8, 2008]. Retrieved from the Internet: URL:http://www.sigmaaldrich.com/catalog/search/ProductDetail/SIAL/A4045.
You've Come A Long Way, Baby, George Milad, www.metalfinishing.com, May 2, 2003.*
IPC-TM-650 Test Methods Manual, The Institute for Interconnecting and Packaging Electronic Circuits, Mar. 1998.*
Hole Preparation & Metalization of High Aspect Ratio, High Reliability Back Panels Part 2, Michael Carano, www.circuitree.com, Feb. 2003, pp. 10-22.*

* cited by examiner

*Primary Examiner*—Edna Wong
(74) *Attorney, Agent, or Firm*—Carmody & Torrance LLP

(57) ABSTRACT

An aqueous acidic copper electroplating composition containing an improved additive system for use at elevated temperatures. The improved additive system comprises (a) a suppressor comprising at least one high molecular weight polymer; (b) a brightener comprising at least one divalent sulfur compound; and (c) a leveler comprising a heterocyclic nitrogen compound. The improved electroplating composition is usable for plating through holes in printed circuit boards.

17 Claims, No Drawings

ACID COPPER ELECTROPLATING BATH COMPOSITION

FIELD OF THE INVENTION

The present invention is directed to an acid copper plating bath having an improved organic additive system comprising suppressors, brighteners and levelers that can provide a desired deposit especially at elevated temperatures.

BACKGROUND OF THE INVENTION

Electrolytic copper plating solutions are used for many industrial applications. For example, electrolytic copper plating solutions are used in the automotive industry to deposit base layers for subsequently applied decorative and corrosion protection coatings. They are also used in the electronic industry, especially during fabrication of printed circuit boards. During circuit fabrication, copper is electroplated over selected portions of the surface of the printed circuit board and onto the walls of through holes passing between the surfaces of the circuit board base material. The walls of the through holes are metallized to provide conductivity between the circuit layers of the printed circuit board. Thus, in many printed circuit board and semiconductor fabrication processes, electroplating has been adopted by industry as the primary deposition means for copper metallization.

Many commercial copper electroplating solutions comprise aqueous solutions of copper sulfate, copper fluorineborate, copper methane sulfonate, copper cyanide, or copper pyrophosphate along with various organic additives that improve the properties of the deposited copper.

The most widely used copper plating electrolyte is based on an aqueous solution of copper sulfate, an acid electrolyte such as sulfuric acid, and various plating additives. Commonly used additives for copper metallization include inhibitors/suppressors, brighteners/accelerators, and/or levelers. The brighteners (or accelerators) change the nucleation process by accelerating the charge transfer process at the copper interface, providing active growth sites, while the suppressors (or inhibitors) adsorb at the cathode surface uniformly, increasing the deposition over-potential. In other words, one of the key functions of the organic additives is to level the deposit by suppressing the electrodeposition rate at protruding areas in the substrate surface and/or by accelerating the electrodeposition rate in recessed areas. The adsorption and inhibition may be further enhanced by the presence of halogen ions.

These organic additives must also be closely controlled (e.g., in the low parts per million range) in order to attain the desired deposit properties and surface morphology.

Brighteners typically comprise sulfur-containing organic compounds, and may also incorporate functional groups, such as described for example in U.S. Pat. No. 5,252,196 to Sonnenberg et al., the subject matter of which is herein incorporated by reference in its entirety. Organic polymers are commonly used as the suppressor additives for copper electroplating. Leveling agents include polyamines and reaction products of an amine with an alkylene oxide and epihalohydrins as well as dye compounds such as phenazinium compounds, as described for example in U.S. patent publication No. US 2007/0108062 to Brunner et al., U.S. patent publication No. US 2006/0226021 to Brunner et al., and U.S. patent publication No. US 2004/0231995 to Murao, the subject matter of each of which is incorporated herein by reference in its entirety.

In most instances, the recommended working temperature for the sulfuric acid plating solution does not exceed about 80° F. (27° C.), and more typically, plating is carried out at room temperature, or about 70-74° F. (21-23° C.). Because these copper plating electrolytes are designed for use at room temperature, they are not generally suited for plating through holes at elevated temperatures. In many instances, the brighteners undergo chemical changes at elevated temperatures and are no longer effective for copper plating. In other instances, the levelers used in combination with the wetter/suppressor additives in the solution present issues leading to the deposition of dull, rough layers, especially inside the through holes. The thermal characteristics of the copper layer deposited at elevated temperatures are also adversely affected and reliability performance is decreased. Failure can also occur during the soldering operation that follows plating.

Printed circuit board fabrication has dramatically increased over the past few years in geographic areas with hot climates. In order to maintain the desired temperature in these areas, chillers or other cooling means are generally needed. Thus, it is desirable to simplify the process in these areas to eliminate the need for chillers or other cooling means and still obtain a desired plating deposit.

To that end, the present invention relates generally to an improved acid copper plating bath composition containing various plating bath additive that provides a desired plating deposit, especially at elevated temperatures.

SUMMARY OF THE INVENTION

It is an object of the present invention to provide an acid copper plating solution having an organic additive system that provides a desired plating deposit at elevated temperatures.

It is another object of the present invention to provide an acid copper plating solution having an improved leveling agent.

It is still a further object of the present invention to provide an improved additive system for acid copper electroplating bath that overcomes the deficiencies of the prior art.

It is still another object of the present invention to provide a method of plating through holes on printed circuit boards that eliminates the need for a cooling system.

To that end, the present invention relates generally to an aqueous copper electroplating solution comprising:
  a) at least one soluble copper salt;
  b) an acid;
  c) a source of halide ions; and
  d) an organic additive system comprising:
    i) a leveler comprising a heterocyclic nitrogen compound;
    ii) a suppressor comprising at least one high molecular weight polymer; and
    iii) a brightener comprising at least one divalent sulfur compound.

In another embodiment, the present invention also relates to an improved organic additive system for an aqueous copper electroplating solution comprising a soluble copper salt, the additive system comprising:
  a) a suppressor comprising at least one high molecular weight polymer;
  b) a brightener comprising at least one divalent sulfur compound; and
  c) a leveler comprising a heterocyclic nitrogen compound.

In still another embodiment, the present invention relates also to a method for electrodepositing copper on a substrate at an elevated temperature, the method comprising:

electrolytically depositing copper on the substrate from an aqueous plating solution, the aqueous plating solution comprising:
   a) a soluble copper salt; and
   b) an additive system comprising:
      i) a suppressor comprising at least one high molecular weight polymer;
      ii) a brightener comprising at least one divalent sulfur compound; and
      iii) a leveler comprising a heterocyclic nitrogen compound.

DETAILED DESCRIPTION OF THE PREFERRED EMBODIMENTS

The plating solutions of the invention are useful for plating copper over a variety of surfaces and for variety of commercial uses. In a preferred embodiment, the solutions are useful for the manufacture of double sided and multilayer printed circuit boards requiring metallized through holes. Furthermore, the plating solutions of the invention are suitable for electrolytically plating copper at elevated temperatures. Accordingly, the following description of the invention is generally directed to printed circuit board fabrication using the solutions and processes of the invention.

In the fabrication of printed circuit boards, the starting material is typically a copper clad plastic, such as a copper clad glass fiber reinforced epoxy panel. In one embodiment, subtractive techniques are used for the fabrication of the board, prior to formation of a circuit, and conductive through holes are formed in the board by drilling and metallization. Various processes for formation of conductive through holes are well known in the art and described in numerous publications such as U.S. Pat. No. 4,515,829, the subject matter of which is herein incorporated by reference in its entirety. Electroless plating procedures are used to form a first metallic coating over the through hole wall and electrolytic copper deposition is then used to enhance the thickness of the deposit. Alternatively, electrolytic copper may be plated directly over a suitably prepared through hole wall as disclosed for example in U.S. Pat. Nos. 4,810,333; 4,895,739; 4,952,286 and 5,007,990, the subject matter of each of which is incorporated herein by reference in its entirety.

The next step in the process comprises depositing copper onto the prepared conductive through hole walls using an electroplating solution in accordance with the present invention.

The present invention relates to a bath composition and a process for electrodepositing copper using a sulfuric acid copper plating electrolyte having a unique organic additive system that enables copper to be plated at elevated temperatures. The bath composition of the invention is suitable for electrolytically plating copper onto a substrate and is suitable for direct current (DC) plating of electronic components such as printed circuit boards (PCBs) within a temperature range of about 70° F. to about 104° F. (about 21-40° C.).

The aqueous copper electroplating solution of the invention typically comprises:
   a) at least one soluble copper salt;
   b) an acid;
   c) a source of halide ions; and
   d) an organic additive system comprising:
      i) a leveler comprising a heterocyclic nitrogen compound;
      ii) a suppressor comprising at least one high molecular weight polymer; and
      iii) a brightener comprising at least one divalent sulfur compound.

The present invention also relates to an improved organic additive system for an aqueous copper electroplating solution comprising a soluble copper salt, the additive system comprising:
   a) a suppressor comprising at least one high molecular weight polymer;
   b) a brightener comprising at least one divalent sulfur compound; and
   c) a leveler comprising a heterocyclic nitrogen compound.

The present invention further relates to a method for electrodepositing copper on a substrate at an elevated temperature using the aqueous plating solution of the invention.

The soluble copper salt is typically a copper salt such as copper sulfate, copper oxide or similar copper salts. The copper is used at a concentration in the range of about 10 to about 60 grams of copper metal per liter of solution, preferably from about 10 to about 20 grams of copper metal per liter of solution.

The acid, which in a preferred embodiment is sulfuric acid is present in the composition at a concentration of about 60 to about 300 grams per liter of solution, preferably from about 150 to about 260 grams per liter of solution.

The source of halide ions is typically a source of chloride ions and includes any chloride salt that is soluble in the electroplating solution. Examples of suitable sources of chloride ions include sodium chloride, potassium chloride, hydrochloric acid and mixtures of one or more of the foregoing. The chloride ion concentration in the solutions of the invention is typically in the range of about 0.02 ppm to about 125 ppm, preferably from about 30 to about 90 ppm, and most preferably from about 50 to about 75 ppm.

The organic additive system typically comprises relative concentrations of:
   i) a suppressor comprising one or more high molecular weight polymers;
   ii) a brightener comprising one or more organic divalent sulfur compounds; and
   iii) a leveler comprising a heterocyclic nitrogen compound.

The suppressor generally comprises one or more polymer compounds which may preferably be polyether compounds. The polymers are believed to induce the catalytic effect of the specific brightener used on copper deposition, resulting in the bright smooth deposit formed at elevated temperatures. In a preferred embodiment, specific alkylene oxides may be used, such as polyoxyethylene- and/or, polyoxypropylene-glycols, which may be single, mixed, or alternating and typically have a molecular weight in the range of 900-5000 grams/mole. More preferably, the suppressors usable in the present invention are selected from the group consisting of poly(ethylene glycol-propylene glycol) mono-butyl ether, $CH_3(CH_2)_3(OCH_2CH_2)x[OCH_2CH(CH_3)]yOH$, preferably 50% by weight of ethylene glycol, with a molecular weight in the range of about 970-1700 grams/mole, more preferably a molecular weight of about 1160 grams/mole; polyoxyethylene lauryl ether, $C_{12}H_{25}(OCH_2CH_2)_nOH$, wherein n is from 12 to 30 and preferably about 23; average MW=1198 grams/mole where n is about 23; polyoxyethylene(100) stearyl ether, $C_{18}H_{37}(OCH_2CH_2)_nOH$, wherein n is from 80-120 but preferably is about 100, average MW=4670 grams/mole where n is about 100. A combination of two or more polymers can also be used. The concentration of the suppressor in the plating solution may range from about 0.01 to about 8 grams/liter.

The brighteners usable in the compositions of the invention are selected from water-soluble organic divalent sulfur compounds, preferably sulfide compounds, and most preferably organic sulfonium sulfonates and organic sulfonium carboxylates. Examples of suitable brighteners include bis(dimethylthiocarbamyl)sulfonium-1-propanesulfonate, 2-dimethylsulfonium-1-propanesulfonate, 2-(diphenyl)sulfonium-1-butanesulfonate, methylbutyl sulfonium ethanecarboxylate, bis(dimethylthiocarbamyl) sulfonium 1-propanecarboxylate and combinations of one or more of the foregoing. The concentration of the brightener in the plating solution may range from about 0.01 to about 100 ppm, more preferably from about 0.1 to about 20 ppm.

The leveler usable in the plating solution of the invention is a specific compound with a high operating temperature capability. The improved leveler of the invention yields smooth, leveled copper deposits at high plating temperatures. The leveling compounds are preferably heterocyclic nitrogen compounds selected from water-soluble, metal ion-containing dyes. In a preferred embodiment, the leveler is an essentially water-insoluble pigment manufactured into a water-soluble dye of cationic nature. One example of a compound usable as the leveler of the invention is A,B,C,D-tetrakis (pyridiniomethyl) Cu(II) phthalocyanine chloride, which is a copper phthalocyanine, that is a water-insoluble compound which after chloromethylation is manufactured into a water-soluble compound and is reacted with pyridine. The compound has the formulation $C_{56}H_{40}Cl_4CuN_{12}$, and has a molecular weight of about 1086 grams/mole. The structure of this compound is set forth below:

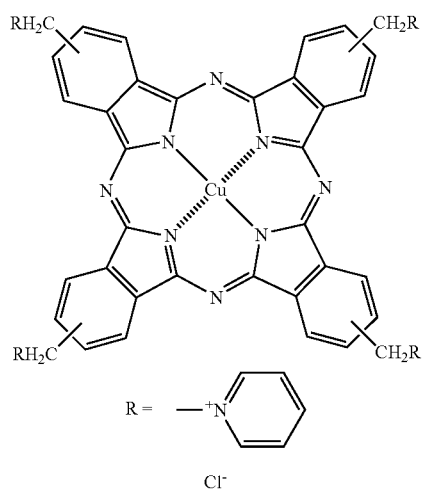

The concentration of the leveler in the plating solution of the invention typically ranges from about 0.001 to about 10 ppm, more preferably from about 0.05 to about 5 ppm.

The acid copper plating bath composition described herein produces deposits which are bright and smooth within a wide range of cathode current densities, for example between about 5 to about 50 amperes per square foot (ASF). The acid copper plating bath described herein is also applicable to both air and airless (eductor) agitation systems.

Eductors are used in many acid copper plating tanks to create turbulent solution flow without the use of air sparging, and, in the case of printed circuit boards, are designed to provide fluid flow across the surface of the printed circuit board. The fluid flow is a product of the plating solution being moved, and the movement is effected by pumps that push the plating solution through at least one manifold feeding nozzle of the eductor type. The advantage of this type of agitation is uniform solution movement across the cathode surface. Eductors eliminate the need for compressed air or air blowers and also provide a safer environment where acid is not constantly being blow into the air or the exhaust system.

The plating bath of the invention deposits smooth, bright, planar and ductile copper layers at elevated temperatures up to about 104° F. (40° C.).

The electroplating baths described herein are particularly useful for direct current plating of through hole walls of printed circuit boards, including through holes having an aspect ratio of up to about eight to one with very good micro-distribution. The aspect ratio is the ratio of the printed circuit board thickness to the diameter of the plated-through hole. The working current density for plating through holes of printed circuit boards is preferably about 10 ASF to about 30 ASF. The micro-distribution is typically in the range of about 80-100% depending upon the aspect ratio and the condition of the through holes.

The thermal characteristics and mechanical properties of the deposited copper are also excellent. The thermal characteristics of plated printed circuit boards were studied by solder shock test per IPC TM-650 2.6.8. The thermal integrity for the through holes was excellent. 6× and 8× solder shock at 550° F. (288° C.) showed no corner cracks and no barrel cracks for 1.0 mm, 0.5 mm, 0.35 mm, 0.25 mm and 0.20 mm plated through holes in 1.6 mm thick boards and for 1.25 mm plated through holes in 2.4 mm thick boards.

The tensile strength of the deposited copper is about 40,000 psi and the elongation is about 20%, tested using an Instron® 5567 instrument, per IPC TM-650 2.4.18.1.

The invention will now be described in relation to the following non-limiting examples.

Example 1

The following plating solution was prepared:

| Component | Concentration |
| --- | --- |
| Copper as copper sulfate | 18.5 g/L |
| Sulfuric acid | 225 g/L |
| Chloride ion | 60 ppm |
| Poly(ethylene glycol-propylene glycol) mono-butyl ether | 0.29 g/L |
| Polyoxyethylene (23) stearyl ether | 0.08 g/L |
| Bis(dimethylthiocarbamyl) sulfonium-1-propanesulfonate | 1.1 ppm |
| Tetrakis(pyridiniomethyl) Cu(II) phthalocyanine chloride | 0.45 ppm |

The temperature of the bath was maintained at about 98° F. and a cathodic current density of 20 ASF was used. The agitation system was an airless (eductor) system.

1.6 mm thick printed circuit boards that incorporated through holes with diameters of 0.2 mm, 0.25 mm, 0.35 mm, 0.50 mm, and 1.0 mm were processed through the plating bath of the invention. Deposited copper was observed to be bright and leveled on the board surface and inside the through holes, on the through walls. The board was tested for thermal reliability performance in accordance with the procedures outlined above. After 6× solder shock at 288° C., no corner crack and no barrel cracks were observed.

Example 2

The following plating solution was prepared:

| Component | Concentration |
| --- | --- |
| Copper as copper sulfate | 15 g/L |
| Sulfuric acid | 260 g/L |
| Chloride ion | 60 ppm |
| Poly(ethylene glycol-propylene glycol) mono-butyl ether | 0.320 g/L |
| Polyoxyethylene (100) stearyl ether | 0.035 g/L |
| Bis(dimethylthiocarbamyl) sulfonium-1-propanecarboxylate | 0.9 ppm |
| Tetrakis(pyridiniomethyl) Cu(II) phthalocyanine chloride | 0.45 ppm |

The temperature of the bath was maintained at about 104° F. and a cathodic current density of 25 ASF was used. The agitation system was an air system.

2.4 mm thick printed circuit boards that incorporated through holes with diameters of 0.30 and 1.25 mm were processed through the plating bath of the invention. Deposited copper was observed to be bright and leveled on the board surface and inside the through holes, on the through walls. The board was tested for thermal reliability performance in accordance with the procedures outlined above. After 6× solder shock at 288° C., no corner crack and no barrel cracks were observed.

While the invention described herein has been particularly shown and described with respect to the preferred embodiments thereof, it will be understood by those skilled in the art that changes in form and details may be made herein without departing from the scope and spirit of the invention. For example, while the present invention has been shown and described in relation to the fabrication of printed circuit boards, the present invention is applicable to any application where it is desirable to utilize an acid copper plating bath at an elevated temperature.

What is claimed is:

1. An aqueous electroplating solution comprising:
   a) at least one soluble copper salt;
   b) an acid;
   c) a source of halide ions; and
   d) an additive system comprising:
      i) a leveler comprising tetrakis(pyridinomethyl) Cu(II) phthalocyanine chloride;
      ii) a suppressor comprising at least one high molecular weight polymer; and
      iii) a brightener comprising at least one divalent sulfur compound.

2. The aqueous electroplating solution according to claim 1, wherein the at least one soluble copper salt is selected from the group consisting of copper sulfate and copper oxide.

3. The aqueous electroplating solution according to claim 1, wherein the acid comprises sulfuric acid.

4. The aqueous electroplating solution according to claim 1, wherein the source of halide ions comprises a source of chloride ions selected from the group consisting of sodium chloride, potassium chloride, hydrochloric acid, and combinations of one or more of the foregoing.

5. The aqueous electroplating solution according to claim 1, wherein the at least one high molecular weight polymer is selected from the group consisting of poly(ethylene glycol-propylene glycol) mono-butyl ether, polyoxyethylene lauryl ether, polyoxyethylene stearyl ether, and combinations of one or more of the foregoing.

6. The aqueous electroplating solution according to claim 1, wherein the at least one high molecular weight polymer comprises at least one material selected from the group consisting of a polymer with a molecular weight of up to about 5000 grams/mole and a polymer with a molecular weight in the range of about 970 to 1200 grams/mole.

7. The aqueous electroplating solution according to claim 1, wherein the at least one divalent sulfur compound is selected from the group consisting of organic sulfonium sulfonates, organic sulfonium carboxylates and combinations thereof.

8. The aqueous electroplating solution according to claim 1, wherein the at least one divalent sulfur compound is at least one of bis(dimethylthiocarbamyl)sulfonium-1-propanesulfonate, 2-dimethylsulfonium-1-propanesulfonate, 2-(diphenyl)sulfonium-1-butanesulfonate, methylbutyl sulfonium ethanecarboxylate, and bis(dimethylthiocarbamyl) sulfonium 1-propanecarboxylate.

9. A method for electrodepositing copper on a substrate at an elevated temperature, the method comprising:
   electrolytically depositing copper on the substrate from an aqueous plating solution, the aqueous plating solution comprising:
   a) a soluble copper salt;
   b) an acid;
   c) a source of halide ions; and
   d) an additive system comprising:
      i) a suppressor comprising at least one high molecular weight polymer; a brightener comprising at least one divalent sulfur compound; and
      iii) a leveler comprising tetrakis(pyridinomethyl) Cu(II) phthalocyanine chloride.

10. The method according to claim 9, wherein the substrate has irregular topography.

11. The method according to claim 9, wherein the substrate is a printed circuit board having through holes.

12. The method according to claim 11, wherein the through holes have an aspect ratio of up to about eight to one.

13. The method according to claim 9, wherein the copper is deposited at a cathode current density of between about 5 and about 50 ASF.

14. The method according to claim 9, wherein the temperature of the aqueous plating solution is between about 27 and about 40° C.

15. The method according to claim 9, wherein the at least one high molecular weight polymer comprises at least one material selected from the group consisting of a polymer with a molecular weight of up to about 5000 grams/mole and a polymer with a molecular weight in the range of about 970 to 1200 grams/mole.

16. The method according to claim 9, wherein the at least one divalent sulfur compound is selected from the group consisting of organic sulfonium sulfonates, organic sulfonium carboxylates and combinations thereof.

17. The method according to claim 9 wherein the at least one divalent sulfur compound is at least of bis(dimethylthiocarbamyl)sulfonium-1-propanesulfonate, 2-dimethylsulfonium-1-propanesulfonate, 2-(diphenyl) sulfonium-1-butanesulfonate, methylbutyl sulfonium ethanecarboxylate, and bis (dimethylthiocarbarnyl) sulfonium 1-propanecarboxylate.

* * * * *

UNITED STATES PATENT AND TRADEMARK OFFICE
CERTIFICATE OF CORRECTION

| | | |
|---|---|---|
| PATENT NO. | : 7,887,693 B2 | Page 1 of 1 |
| APPLICATION NO. | : 11/821206 | |
| DATED | : February 15, 2011 | |
| INVENTOR(S) | : Maria Nikolova et al. | |

It is certified that error appears in the above-identified patent and that said Letters Patent is hereby corrected as shown below:

Column 8, Lines 31 through 33

DELETE:

"i) a suppressor comprising at least one high molecular weight polymer; a brightener comprising at least one divalent sulfur compound; and"

AND REPLACE IT WITH:

-- i) a suppressor comprising at least one high molecular weight polymer;

ii) a brightener comprising at least one divalent sulfur compound; and --

Signed and Sealed this
Fifth Day of April, 2011

David J. Kappos
*Director of the United States Patent and Trademark Office*